United States Patent [19]

Orban

[11] Patent Number: 5,737,434
[45] Date of Patent: Apr. 7, 1998

[54] MULTI-BAND AUDIO COMPRESSOR WITH LOOK-AHEAD CLIPPER

[75] Inventor: Robert Orban, Belmont, Calif.

[73] Assignee: Orban, Inc., San Leandro, Calif.

[21] Appl. No.: 703,026

[22] Filed: Aug. 26, 1996

[51] Int. Cl.$^6$ ..................... H03G 7/00
[52] U.S. Cl. ............ 381/106; 381/104; 333/14
[58] Field of Search .................... 381/106, 100, 381/107, 104, 98, 94.2, 94.5, 94.8; 333/14, 28 T

[56] References Cited

U.S. PATENT DOCUMENTS

| | | |
|---|---|---|
| 4,208,548 | 6/1980 | Orban . |
| 4,249,042 | 2/1981 | Orban ................ 381/106 |
| 4,412,100 | 10/1983 | Orban . |
| 4,460,871 | 7/1984 | Orban . |
| 4,525,857 | 7/1985 | Orban ................ 381/100 |
| 4,947,133 | 8/1990 | Thomas ............... 381/106 |
| 5,050,217 | 9/1991 | Orban ................ 381/106 |
| 5,168,526 | 12/1992 | Orban . |
| 5,204,909 | 4/1993 | Cowan ................ 333/14 |
| 5,245,299 | 9/1993 | Bader ................. 381/106 |
| 5,369,711 | 11/1994 | Williamson, III ...... 381/104 |
| 5,444,788 | 8/1995 | Orban ................ 381/106 |
| 5,563,913 | 10/1996 | Akagiri et al. ........ 381/106 |
| 5,574,791 | 11/1996 | Orban ................ 381/106 |

FOREIGN PATENT DOCUMENTS 8802201  3/1988  WIPO ................... 381/106

OTHER PUBLICATIONS

"Pulse Networks with Parabolic Distribution of Poles", IRE Trans. Circuit Theory, vol., CT-9, pp. 302-305, Sep. 1961.
"The Dynamic Characteristics of Limiters for Sound Programme Circuits", Research Report No. EL-5, UDC 534.86: 621.395. 665.1, 1967/13, The British Broadcasting Corp. Engineering Div.

Primary Examiner—Curtis Kuntz
Assistant Examiner—Xu Mei
Attorney, Agent, or Firm—Blakely, Sokoloff, Taylor & Zafman

[57] ABSTRACT

An audio peak limiter suitable for use between a compressor and pre-emphasis circuit. The limiter uses a center clipper to develop a control signal for a 1/x control law VCA. The center clipping, after rectification, is sampled-and-held for 4 milliseconds by a retriggerable sample-and-hold circuit then low-pass filtered. The compressed audio is delayed for 4 milliseconds before being coupled to the VCA. The VCA acts as a modulator to provide control of its peak output level while simultaneously limiting the bandwidth of the modulation sidebands caused by the modulation process, so that these sidebands are better masked psychoacoustically than sidebands that would be caused by simple clipping of the compressed audio.

10 Claims, 1 Drawing Sheet

MULTI-BAND AUDIO COMPRESSOR WITH LOOK-AHEAD CLIPPER

BACKGROUND OF INVENTION

1. Field of the Invention

The invention relates to audio processing, more particularly to compression of audio signals and peak limiting of such signals.

2. Prior Art

Multi-band audio compressors are commonly used to process audio signals intended for radio transmission, release on compact disk, release in multimedia formats such as CD-ROM, and release in other media, analog or digital, having limited dynamic range and a well-defined peak overload level. The advantages of compressing in multiple bands and means for doing so are disclosed and discussed in U.S. Pat. Nos. 4,249,042; 4,412,100, and 4,460,871.

In many cases, a peak limiter is placed after the summation of the outputs from the various bands. If the peak limiter is essentially a clipper it does not reduce loudness unnaturally but can cause objectionable distortion if overdriven. U.S. Pat. No. 4,208,548 discloses one means of controlling the distortion of such a clipper by making a psychoacoustic estimate of whether the distortion is masked, and then automatically adjusting the drive level to the clipper to ensure that the clipper-induced distortion is never objectionable to the ear. Other simpler systems can also be used that employ peak-sensing level detectors, average-sensing level detectors, or some combination thereof instead of psychoacoustic estimates to control the drive level into the clipper. This control can be in a single frequency band or in several bands.

In all cases these expedients can cause unnatural sound quality because they reduce the drive level into the clipper as a function of the peak-to-average ratio of the audio, changing loudness in an unnatural manner. This defeats the primary advantage of the preceding multi-band compression. Specifically the advantages is the compression of the signal in a way that is psychoacoustically natural by preventing spectral gain intermodulation and by controlling loudness so that it is approximately constant. This avoids modulating the peak-to-average ratio of the input audio. The latter requires fairly slow attack times (in the order of 2 milliseconds or above) so that the gain is not reduced by every narrow spike in the input waveform.

The design challenge in this kind of audio processing system is thus to prevent unnatural loudness variations while simultaneously limiting peak output levels to a fixed threshold without overshooting.

SUMMARY OF THE INVENTION

An audio processing apparatus that includes a compressor, peak limiter and pre-emphasis circuit is disclosed. The peak limiter uses a center clipped signal which is sampled-and-held and low-pass filter to provide a control signal to an inverse law VCA. A delay equal in time to the sample-and-hold period is provided in the audio path before the audio signal is coupled to the VCA.

DETAILED DESCRIPTION OF INVENTION

Figure 1:
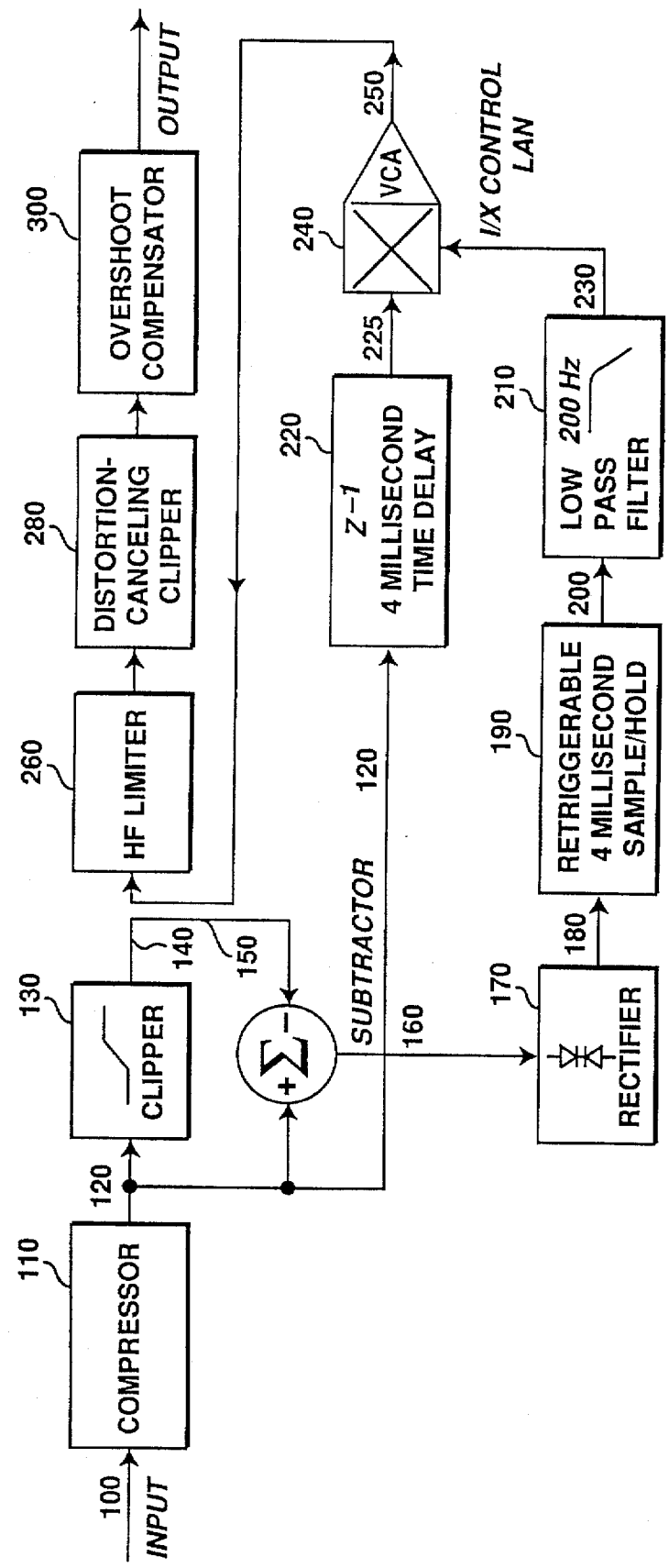
FIG. 1 is a block diagram of the audio compressor of the present invention.

A multiband audio compressor is disclosed. In the following description, numerous specific details are set forth such as specific times and frequencies in order to provide a thorough understanding of the present invention. It will be apparent that these details are not needed to practice the present invention. In other instances, well-known circuits have not been described in detail in order not to obscure the present invention.

Overview of the Invention

In its general form, the present invention replaces the clipper in an audio processing system with a very fast look-ahead peak limiter, realized by a center-clipper comprising clipper 130 and subtractor 140, rectifier 170, sample-and-hold circuit 190, low-pass filter 210, two-quadrant divider 240, and audio delay line 220 of the figure. U.S. Pat. No. 5,168,526 explains how a center-clipper, rectifier, and two-quadrant divider can perform the function of simple audio clipping. The advantage of the more complex circuit is that signal processing can be applied to the control signal before the divider receives it.

In the presently preferred embodiment of the present invention, the audio signal, after being processed by compressor 110, is applied to a center clipper comprising the clipper 130 and subtractor 140 and to a 4 millisecond delay line 220. The output of the center-clipper is rectified by rectifier 170. The rectified signal on line 180 is applied to a sample-and-hold circuit 190 that holds the peak output of the rectifier 170 for approximately 4 milliseconds. A low-pass filter 210 with a rise time (0 to 100%) of slightly less than 4 milliseconds receives the output of the sample-and-hold circuit 190 on line 200. The control port of divider 240 receives a control signal from the output of the low-pass filter on line 230.

It can be seen that sample-and-hold circuit 190 holds the peak value of the rectified, center-clipped signal long enough to permit the output of low-pass filter 210 to rise to the full peak value of the rectified, center-clipped signal. The output of filter 210 rises to this value just in time to coincide with (and thus to control) the associated audio peak that originally produced the control signal because this audio signal was delayed four milliseconds before being applied to divider 240.

The divider can be considered a double sideband amplitude modulator whose "carrier" is the delayed audio signal and whose "modulation" is the inverse of the signal applied to the divider's control port (line 230). The process of modulation creates sidebands around each Fourier frequency component of the input audio. The occupied bandwidth of these sidebands (in Hertz) is, to a first approximation, equal to the cutoff frequency of low-pass filter 210. (This is justified by observing that the Taylor series expansion of 1/x about 0 is 1−x+ . . . ).

It is known from psychoacoustics that the closer in frequency an undesired sound is to a desired sound, the more effectively the undesired sound is psychoacoustically "masked" (i.e., covered up or "drowned out") by the desired sound. This relationship breaks down when the desired and undesired sounds are closer than a "critical band" (typically one-third octave), at which point no further increase in masking occurs. We can therefore assume that as the cutoff frequency of low-pass filter 210 is lowered, the audibility of the distortion caused by the look-ahead peak limiting process continually decreases. This is true until the cutoff frequency of filter 210 becomes so low that the distortion produced by the modulation process is all within one critical band of all significant frequencies in the audio signal being controlled, at which point the audibility of the distortion does not decrease any further. In the currently preferred embodiment of the invention the cutoff frequency of low-pass filter 210 is approximately 200 Hz, so the modulation distortion applied to all frequency components extends ±200 Hz on either side of a given spectral line. Since 200 Hz is one-third octave with reference to 770 Hz, all distortion applied to frequency components in the original audio signal higher than approximately 770 Hz is maximally masked, because these distortion components are closer than one-third octave to the original undistorted "carrier" frequencies. The range above 770 Hz includes the frequency components to which the ear is most sensitive because the ear is most sensitive between 1 and 5 kHz.

Contrast this with the effect of simple clipping, which is equivalent to the bandwidth of filter 210's being infinitely wide. In simple clipping there is essentially no limit on the bandwidth of modulation products caused by the clipping and therefore these distortion components are far more likely to be unmasked and audible.

If the peak controller in the present invention is considered as a peak limiter with an "attack time" and "release time," these time constants are equal and are both determined by the step response of filter 210 and the hold time of sample-and-hold 190. In the currently preferred embodiment, both attack and release are approximately 4 milliseconds; sample-and-hold 190 ensures that the output the low-pass filter 210 will rise to the full peak value of its input, even if that input is of very short duration.

Comparisons to BBC Limiter of the Prior Art

In comparing the action of the present invention to the delay line limiter shown in "The Dynamic Characteristics of Limiters for Sound Programme Circuits", Research Report No. EL-5 by BBC (BBC limiter), we see that the release time of the BBC limiter is much longer (as long as several seconds) and is determined by a time-constant network that is independent of the low-pass filtering applied to the BBC limiter's gain-control signal. The attack time of the BBC limiter is approximately 280 microseconds and is determined by the low-pass filtering applied to its gain-control signal. This means that the BBC delay line limiter operates on the peak envelope of the signal as opposed to operating on the actual signal waveform, the latter being the mode of operation of the present invention. For example, with a typical male speech waveform, the control signal of the BBC limiter will cause the gain to be reduced for hundreds of milliseconds, audibly reducing perceived loudness over this period of time. In contrast, the present invention reduces gain on every cycle of the speech waveform, recovering almost to full gain in between the peaks of the wave. So the present invention does not tend to audibly reduce loudness even when it is substantially reducing gain. It is not unusual to see the present invention reduce gain as much as 6 dB on some waveforms without substantially reducing loudness or causing audible distortion.

To further compare the BBC limiter with the current invention, the BBC design is intended to be a complete peak limiter, accepting uncontrolled audio at its input. By contrast, the peak controller in the present invention is intended to replace a clipper in a gain control system. It is assumed that the average level of the input to the present invention has been previously controlled by another device like a multi-band compressor, which prevents overdriving the present invention to beyond approximately 6 dB gain reduction, preventing it from causing audible distortion.

Details of One Embodiment

Referring to the figure, compressor 110 receives the unprocessed audio on line 100. Compressor 110 is preferably a multi-band compressor like that disclosed in U.S. Pat. No. 4,249,042. The average power of the waveform on line 120 is well-controlled but the peak level is not because compressor 110 does not perform a peak-limiting function.

The signal on line 120 is applied to a center clipper, consisting of clipper 130 and subtractor 140. Subtractor 140 subtracts clipper 130's input signal on line 120 from its output signal on line 150. The output of subtractor 140 on line 160 is thus only those parts of the waveform on line 120 that exceed the threshold of clipping of clipper 130. Clipper 130 is a conventional audio clipper and could be realized with biased diodes or back-to-back zener diodes. Such circuits are well-known in the prior art. The subtractor can be a conventional differential amplifier, realized with an opamp. These functions can also be mathematically modeled within a digital-signal-processing (DSP) environment. Rectifier 170 receives the signal on line 160, creating its absolute value. See U.S. Pat. No. 5,168,526 for additional details.

The signal representing the absolute value on line 180 is applied to re-triggerable sample-and-hold circuit 190. This circuit constantly compares its input and output. If the input level exceeds the output level, the circuit holds this input level at its output for a fixed time (four milliseconds in the currently preferred embodiment) and then permits the output level to discharge very quickly towards zero with the input/output comparison function still active. As soon as the input level again exceeds the output level, the input level is held by the output and the cycle begins again. If the input exceeds the held output before the expiration of the hold time, the output level moves to the new, higher input level and holds this new level. The timer retriggers, starting again at 0 when this occurs. This algorithm can be realized in DSP, or by an analog circuit using well-known circuits. The output of circuit 190 on line 200 consists of a series of steps with a maximum width equal to the hold time. Some steps will be shorter than the hold time. These represent the case where the input rose higher than the held output during the hold time, stepping the output to a higher level and restarting the timer.

Low-pass filter 210 is preferably an all-pole, third-order, low-pass filter with a parabolic distribution of poles and a cutoff frequency of approximately 200 Hz. This corresponds to a rise time of approximately 3.5 milliseconds. The step response of a third-order parabolic filter overshoots approximately 2%, ensuring that the control signal at the filter's output on line 230 will rise far enough to correctly control the peak audio level. In DSP, the cutoff frequency of filter 210 is far below the Nyquist frequency (typically 16–20 kHz), so virtually any transformation could be used to create an appropriate digital infinite-impulse-response (IIR) filter with insignificant frequency distortion. The bilinear transformation is preferred because it ensures that the resulting filter will adequately remove high-frequency energy, preventing this energy from creating undesirably wide modulation sidebands. (See: S. K. Mullick, "Pulse Networks with Parabolic Distribution of Poles," *IRE Trans. Circuit Theory*, vol. CT-9, pp. 302–305, September, 1961).

The output of low-pass filter 210 on line 230 is applied to the control input of divider 240, which divides the signal on line 225 by the signal on line 230 to produce the peak-controlled signal on line 250. The divider can be a conventional analog voltage-controlled amplifier (VCA) such as part number CA3280, manufactured by Harris Semiconductor. In DSP, the divide function is simple and well-defined.

The signal on line 225 is delayed by approximately four milliseconds by delay line 220. In an analog circuit, delay line 220 can be implemented with a bucket-brigade or charge-coupled device. In DSP, it is a shift register.

If the system being driven does not use pre-emphasis (such as most digital systems, CDs, etc.), then the system output can be taken directly from line 250. However, if the system uses pre-emphasis, a cascade of high-frequency limiter 260 (which also applies the pre-emphasis), distortion-canceling clipper 280, and overshoot compensator 290 may be used. The currently preferred embodiment of the distortion-canceling clipper 300 is described in U.S. Pat. No. 4,208,548, and the currently preferred embodiment of the overshoot compensator is described in U.S. Pat. No. 4,460,871. These additional elements provide peak limiting to compensate for the added peak level caused by the pre-emphasis.

While it is not intuitively clear that applying peak limiting to the signal on line 250 before pre-emphasis will prevent excessive distortion in distortion-canceling clipper 280 following pre-emphasis and HF limiting 260, experiment shows that this is true. Distortion-canceling clipper 280 cannot be overdriven at low frequencies without introducing objectionable distortion in the system. Because the pre-emphasis used in broadcast or CDs (typically 50 µs or 75 µs) typically introduces little extra gain below approximately 1 kHz, the peak level control implemented by the look-ahead clipping system effectively controls peak levels at frequencies below 1 kHz, preventing distortion in clipper 280 as desired.

Thus, a look ahead clipper, which masks distortion and which is intended for use with a compressor has been disclosed.

I claim:

1. An audio processing apparatus comprising:

a compressor for compressing an input audio signal;

a peak limiter coupled to the output of the compressor for limiting peaks of the input audio signal after compression by the compressor, the limiter including delaying the input audio signal after compression such that the limiting occurs in time coincidence with a control signal developed from the audio signal, the peak limiter also including a center-clipper, retriggerable sample-and-hold circuit and a low-pass filter where a holding period of the sample-and-hold circuit is approximately equal in time to the delaying of the input audio signal after compression; and, a circuit for providing pre-emphasis coupled to the output of the peak limiter.

2. The apparatus defined by claim 1 wherein the low-pass filter has a rise time approximately slightly less than the holding period of the sample-and-hold circuit.

3. An audio processing apparatus comprising:

a compressor for compressing an input audio signal;

a peak limiter coupled to the output of the compressor for limiting peaks of the input audio signal after compression by the compressor, the limiter including delaying the input audio signal after compression such that the limiting occurs in time coincidence with a control signal developed from the audio signal the peak limiter also including a center-clipper, retriggerable sample-and-hold circuit and a low-pass filter;

where a holding period of the sample-and-hold circuit is approximately equal in time to the delaying of the input audio signal after compression; and, a circuit for providing pre-emphasis coupled to the output of the peak limiter;

wherein an output of the low-pass filter provides a control signal for a voltage controlled amplifier (VCA), an input of the VCA being coupled to receive the input audio signal after compression and the delaying of the input audio signal, an output of the VCA being coupled to the circuit for providing pre-emphasis and where an output of the low-pass filter provides a control signal for the VCA.

4. The apparatus defined by claim 3 wherein the VCA is an inverse law control device.

5. An audio signal limiter comprising:

a center clipper coupled to receive the audio signal;

a retriggerable sample-and-hold circuit coupled to receive a center clipped signal from the clipper;

a low-pass filter coupled to the sample-and-hold circuit;

a delay circuit coupled to receive the audio signal, where a hold time of the sample-and-hold circuit approximately equals a delay provided by the delay circuit; and, a divider circuit coupled to the delay circuit and low-pass filter.

6. The limiter defined by claim 5 wherein the divider circuit is a voltage controlled amplifier (VCA) having a 1/x control law, where the output of the low-pass filter provides a control signal to the VCA.

7. The limiter defined by claim 6 wherein the low-pass filter has a rise time approximately slightly less than the hold time of the sample-and-hold circuit.

8. The limiter defined by claim 7 wherein the low-pass filter has a cutoff frequency of approximately 200 Hz.

9. A method for processing an audio signal comprising the steps of:

compressing the audio signal;

delaying the compressed audio signal;

center clipping the compressed signal;

sampling-and-holding the center clipped compressed signal with a hold period approximately equal to the delaying of the compressed audio signal;

low-pass filtering results of the sampling-and-holding to provide a control signal;

modulating the delayed compressed signal with the control signal so as to create sidebands around the frequency components of center clipped portions of the compressed delayed audio signal.

10. The method defined by claim 9 wherein the modulating includes:

dividing the delayed compressed signal by the results of the low-pass filtering.

* * * * *